United States Patent
Topp et al.

(10) Patent No.: US 6,919,507 B2
(45) Date of Patent: Jul. 19, 2005

(54) ELECTRICAL ASSEMBLY AND METHOD FOR MANUFACTURING THE ELECTRICAL ASSEMBLY

(75) Inventors: Rainer Topp, Reutlingen (DE); Laura Reyes Tello, Cardiff (GB); Arne Bartels, Braunschweig (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/343,882
(22) PCT Filed: Jul. 20, 2001
(86) PCT No.: PCT/DE01/02753
§ 371 (c)(1),
(2), (4) Date: Sep. 17, 2003
(87) PCT Pub. No.: WO02/13585
PCT Pub. Date: Feb. 14, 2002

(65) Prior Publication Data
US 2004/0041276 A1 Mar. 4, 2004

(30) Foreign Application Priority Data
Aug. 8, 2000 (DE) .......................................... 100 38 508

(51) Int. Cl.$^7$ ............................. H01L 23/28; H05K 5/06
(52) U.S. Cl. ...................................... 174/52.2; 257/790
(58) Field of Search ................................ 174/52.2, 52.4; 257/787, 790

(56) References Cited

U.S. PATENT DOCUMENTS

| | | | |
|---|---|---|---|
| 4,739,449 A | 4/1988 | Kaufman | 361/713 |
| 5,087,961 A * | 2/1992 | Long et al. | 257/701 |
| 5,386,342 A * | 1/1995 | Rostoker | 361/749 |
| 5,547,730 A | 8/1996 | Weiblen et al. | 428/76 |
| 5,686,162 A * | 11/1997 | Polak et al. | 428/76 |
| 5,699,232 A | 12/1997 | Neidig et al. | 361/732 |
| 6,350,953 B1 * | 2/2002 | Franzen | 174/52.2 |
| 6,586,105 B2 * | 7/2003 | Eguchi et al. | 428/447 |

FOREIGN PATENT DOCUMENTS

| | | |
|---|---|---|
| DE | 197 22 355 | 12/1998 |
| EP | 0 575 889 | 12/1993 |

* cited by examiner

Primary Examiner—Hung V. Ngo
(74) Attorney, Agent, or Firm—Kenyon & Kenyon

(57) ABSTRACT

An electrical assembly including an electrical circuit situated in a housing, and a method for the manufacture of such an assembly, in which the electrical circuit is covered at least partially with a protective layer, wherein the protective layer has first and second regions having different hardnesses, so that the protective layer can be optimized with respect to mechanical and thermal loading capacity.

15 Claims, 1 Drawing Sheet

ELECTRICAL ASSEMBLY AND METHOD FOR MANUFACTURING THE ELECTRICAL ASSEMBLY

BACKGROUND INFORMATION

From German Patent Application No. 19722355.9, it is known to use a silicon gel as a covering layer in order to protect the electronic circuit. Under certain conditions of use of the electronic module, damages of the bonding wires up to complete breakages of the wires, caused by mechanical action of the gel on the bonding wires, can occur during the life of the module, resulting in functional failure of the module. According to the selected degree of hardness of the gel, various failure mechanisms can occur in this context. If the gel is too soft, and there are vibrational stresses on the module, as can occur for example in the case of an aggregate construction, then the gel compound, which may not be selected arbitrarily low in hardness due to the requirement of a complete covering of the components to be protected, can be excited to strong resonance vibrations that are in turn transmitted to the bonding wires. The resulting cyclical motion of the bonding wires then finally leads to a mechanical splitting and breakage of the bonding wires. Using a hard gel, the problems caused by mechanical resonance vibrations can as a rule be sufficiently suppressed, but in general silicon gel has a high thermal coefficient of expansion. If changes of temperature occur at the module, this has the result that the gel must move around the bonding wires in a flowing motion, because these wires cannot be deformed as strongly as would be necessary in order to be able to follow the thermally caused gel motion. If the hardness of the gel is too great, these flowing motions can then likewise exert mechanical forces on the bonding wires that are so strong that these wires finally break, given sufficiently strong and frequent changes of temperature.

SUMMARY OF THE INVENTION

The electrical assembly according to the present invention, and the method according to the present invention for manufacturing an electrical assembly, have the advantage that a protective layer can be provided that is optimized with respect to mechanical and thermal loading capacity. No constructive measures are required at the electrical assembly itself, and no additional mechanical parts are required in order to fix the various regions in relation to one another or in order to prevent resonance vibrations of the material of the protective layer. On the one hand, the assembly is fail-safe even under extreme demands with respect to vibrational stress and temperature, while on the other hand it is well-protected against moisture, and in addition can be manufactured with only a slight additional manufacturing expense.

It is particularly advantageous to manufacture first regions, which surround elements that are mechanically sensitive and/or sensitive to corrosion, from a soft material, so that these elements are protected against moisture without being damaged mechanically when there are changes in temperature, because the soft gel can flow sufficiently around the bonding wires, while hard second regions, situated in complementary fashion hereto, protect the overall protective layer against damaging resonance vibrations and bonding damages potentially resulting therefrom. In the case of coverage of the first regions by the second regions, the first regions are additionally protected against the effects of moisture.

The use of gel materials has the advantage that these materials can economically be hardened at the same time, in a single baking process.

A simple limitation between the first and second regions can advantageously take place through the use of a thixotropic gel, i.e., a gel that is relatively fluid when in motion (when being poured in), and which, as soon as it comes to rest, enters into a gel-type state (thixotropy=reversible conversion between colloidal solution and gel). This thixotropic gel type that is first brought in can easily be brought into the desired regions, for example using a movable dispensing device that can be flexibly adjusted. In this way, the desired localization of the various gel types can be achieved without an additional constructive expense, and both gel regions can be hardened in a common baking step, without mixing of the two regions.

In a flexible manner, adapted to the constructive boundary conditions of the module, it is possible either first to distribute a thixotropic soft gel type in bonding wire regions, or to distribute a thixotropic hard gel type in regions without bonding wires, and subsequently to pour the other gel type in flowing fashion into the remaining open regions of the interior of the module.

DETAILED DESCRIPTION

Figure 1:
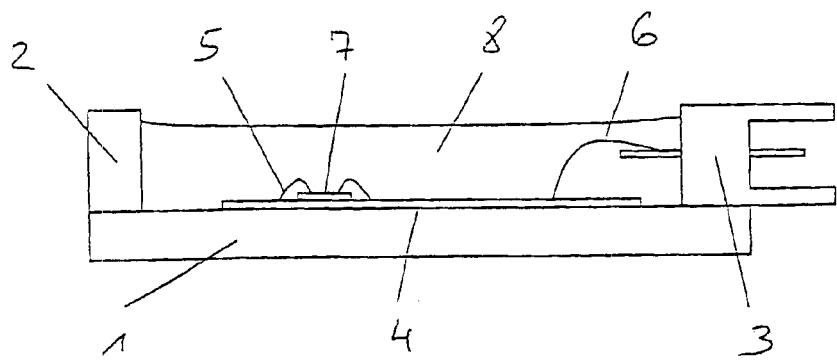
FIG. 1 shows a system known from the prior art.

FIG. 1 shows a cross-sectional side view of an electrical assembly known from the prior art. Base plate 1 of the housing is surrounded by a frame 2 having a male connector 3 on one side. This male connector 3 is used for the contacting of an electronic circuit 4 that is connected with the male connector via thick wire bonds 6 (in the drawing, only one such wired connection 6 is shown). On electronic circuit 4 there is situated an unhoused semiconductor chip 7 that is connected electrically with the circuit via thin wire bonds 5. The housing is filled with silicon gel 8 to such an extent that all bonding wires are insulated from the surrounding air.

The filling with silicon gel protects the electronic circuit in order to protect unhoused chips and bonding wires from the effect of moisture; here it is necessary to cover the components to be protected with gel completely in order to ensure a sufficient protection against moisture. As an additional component of the module, a covering cap can be attached over the housing frame, which protects the elements of the interior of the module from mechanical damage, but which without the silicon gel does not represent a sufficient protection against moisture for the interior components of the module. In principle, the hardness of the gel can be set in a medium range, in such a way that the failure mechanisms (described above in more detail) that are to be expected given a too-soft or a too-hard gel are avoided. However, under certain conditions of use of an electrical assembly (geometric boundary conditions, thermal demands, vibrational stresses) it can happen that the two failure ranges—those connected with a too-hard and a too-soft gel—can overlap; i.e., no medium gel hardness can be found with which the two failure mechanisms can be reliably prevented.

Figure 2:
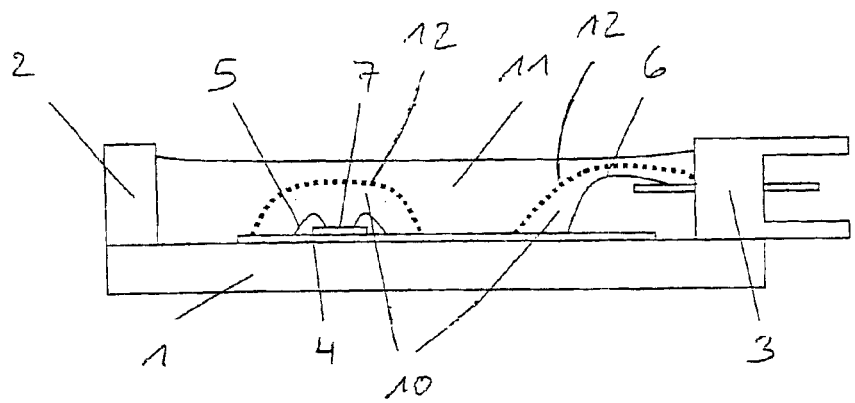
FIG. 2 shows a first exemplary embodiment of the present invention.

FIG. 2 shows an electrical assembly that is identical to that shown in FIG. 1 except for the filling with silicon gel. Instead of a homogenous silicon gel layer 8, the assembly has a filling of the space limited by the housing frame and base plate 1 with first regions 10 of soft silicon gel, and, delimited from the first regions by a transition region 12, with second regions 11 of hard silicon gel. The first regions are situated around the areas of the electronic circuit in which there are bonding wire connections. The second regions fill the rest of the space.

The manufacture of the protective layer of gel takes place through the filling of the regions provided with bonding wire connections with a thixotropic soft gel; subsequently, the remaining regions are filled with a liquid hard gel. Here, the terms "soft" and "hard" refer to the consistency after hardening has taken place, which can take place through heating of the overall system after filling with the two types of gel, the two regions hardening simultaneously.

Figure 3:
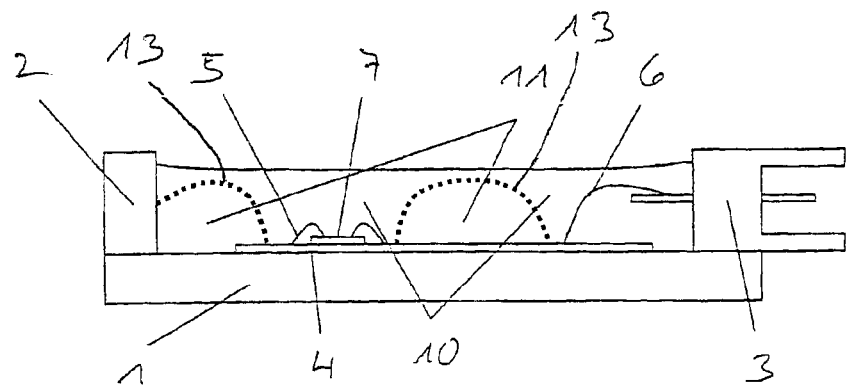
FIG. 3 shows a second exemplary embodiment of the present invention.

FIG. 3 likewise shows an electrical assembly that is identical to that shown in FIG. 1 except for the filling with silicon gel. Instead of a homogenous silicon gel layer 8, the assembly has, similar to the representation shown in FIG. 2, a filling of the space limited by the housing frame and base plate 1 with first regions 10 of soft silicon gel, and, delimited from the first regions by a transition region 13, with second regions 11 of hard silicon gel. The first regions are situated around the areas of the electronic circuit in which there are bonding wire connections. The second regions are situated between these, the first regions also extending above the second regions, and thus filling the remaining space.

The manufacture of this system takes place in that areas apart from bonding wire connections are first filled with thixotropic hard gel. Subsequently, the remaining regions are filled with liquid soft gel. There then takes place a hardening step through heating of the overall system, in which both types of gel harden at the same time.

What is claimed is:

1. An electrical assembly comprising:
    a housing;
    an electrical circuit situated in the housing, the electrical circuit including elements that are at least one of (a) sensitive to corrosion and (b) mechanically sensitive; and
    a protective layer at least partially covering the electrical circuit, the protective layer being constructed from gel materials, the protective layer including first regions and second regions, the first regions being softer than the second regions, the elements of the electrical circuit being surrounded at least partially by at least one of the first regions.

2. The electrical assembly according to claim 1, wherein the elements of the electrical circuit include bonding wires.

3. The electrical assembly according to claim 2, wherein the first regions substantially surround the bonding wires, and the second regions and the housing substantially enclose the first regions and the electrical circuit.

4. The electrical assembly according to claim 2, wherein the second regions are situated apart from the bonding wires, and the first regions and the housing substantially enclose the second regions and the electrical circuit.

5. The electrical assembly according to claim 2, wherein the first regions are configured to prevent mechanical damage to the bonding wires, the mechanical damage being prevented by the first regions flowing around the bonding wires.

6. The electrical assembly according to claim 2, wherein the second regions are configured to protect the bonding wires against resonance vibrations.

7. The electrical assembly according to claim 1, wherein the gel materials include silicon gels.

8. The electrical assembly according to claim 1, wherein the first regions are composed of a thixotropic material.

9. The electrical assembly according to claim 1, wherein the second regions are composed of a thixotropic material.

10. A method for manufacturing an electrical assembly comprising:
    situating an electrical circuit in a housing, the electrical circuit including elements that are at least one of (a) sensitive to corrosion and (b) mechanically sensitive; and
    covering, at least partially, the electrical circuit with a protective layer made of gel materials, the protective layer including first regions and second regions, the first regions being softer than the second regions, wherein the covering of the electrical circuit includes applying the first regions in an area of the elements of the electrical circuit.

11. The method according to claim 10, wherein the first regions are applied in an area of bonding wires.

12. The method according to claim 10, wherein the gel materials include silicon gels.

13. The method according to claim 10, wherein at least one of the first regions includes a thixotropic material.

14. The method according to claim 13, wherein the second regions include a thixotropic material.

15. The method according to claim 14, further comprising hardening the first and second regions at the same time.

* * * * *